United States Patent [19]

Pumo et al.

[11] Patent Number: 4,540,898
[45] Date of Patent: Sep. 10, 1985

[54] CLOCKED BUFFER CIRCUIT USING A SELF-BOOTSTRAPPING TRANSISTOR

[75] Inventors: Joseph Pumo, Austin, Tex.; Marc J. E. Belleville, Grenoble, France

[73] Assignee: Motorola, Inc., Schaumburg, Ill.

[21] Appl. No.: 472,898

[22] Filed: Mar. 7, 1983

[51] Int. Cl.[3] .................. H03K 3/027; H03K 4/58; H03K 17/04; H03K 19/017
[52] U.S. Cl. .................. 307/269; 307/453; 307/481; 307/482; 307/578
[58] Field of Search ............ 307/452, 453, 481, 482, 307/578, 269, 270, 264, 592, 594, 448, 246

[56] References Cited
U.S. PATENT DOCUMENTS

| | | | |
|---|---|---|---|
| 3,774,055 | 11/1973 | Bapat | 307/482 X |
| 3,903,431 | 2/1975 | Heeren | 307/453 |
| 3,989,955 | 11/1976 | Suzuki | 307/481 X |
| 4,090,096 | 5/1978 | Nagami | 307/481 X |
| 4,381,460 | 4/1983 | Menachem | 307/482 X |

Primary Examiner—Stanley D. Miller
Assistant Examiner—David R. Bertelson
Attorney, Agent, or Firm—Anthony J. Sarli, Jr.; Jeffery Van Myers; James L. Clingan, Jr.

[57] ABSTRACT

A clocked buffer circuit is provided which uses a self-bootstrapping transistor to provide a full power supply output signal in response to an input signal and a full power supply clock signal. The self-bootstrapping transistor is disabled by a delay circuit prior to the removal of the clock signal so that the output signal is still provided after the removal of the clock signal. That the output signal reaches full power supply is ensured because the disabling effect of the delay circuit is triggered by the output signal itself.

8 Claims, 1 Drawing Figure

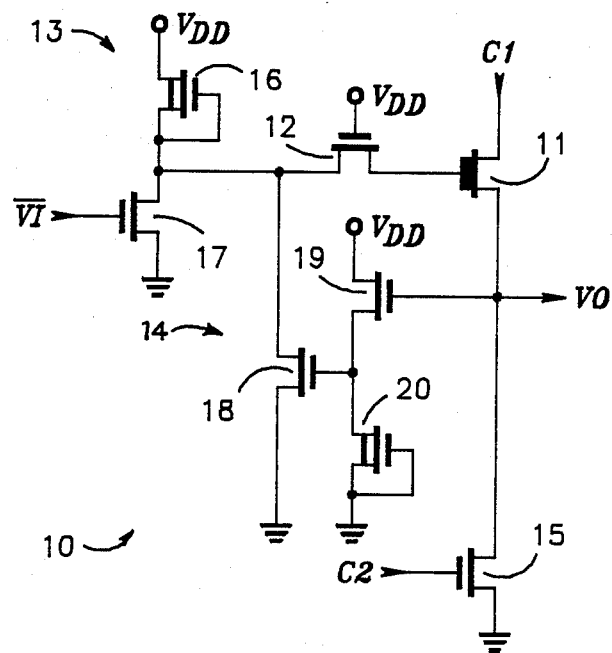

CLOCKED BUFFER CIRCUIT USING A SELF-BOOTSTRAPPING TRANSISTOR

BACKGROUND OF THE INVENTION

This invention relates, in general, to buffer circuits, and more particularly, to clocked buffer circuits.

In a complex integrated circuit such as a microcomputer or a circuit which is to interface with a microcomputer there are strict timing controls for receiving and transmitting various data and control signals. In modern circuits there is normally only a single 5 volt power supply available. Particularly in circuits designed in a single channel MOS technology, for example NMOS, there is a problem with maintaining sufficient signal levels for the generation and timing of all the required signals. This is due primarily to the 0.6 to 1.2 threshold voltage of NMOS enhancement transistors. The use of depletion and natural transistors with threshold voltages of $-1.1$ to $-1.4$ and 0.0 to 0.4, respectively, have been found to be helpful in this regard. Due to power restraints and restraints on available chip area, natural and depletion devices must be used judiciously.

Various bootstrap techniques have been developed to retain signal levels at 5 volts while also retaining a large amount of power. One of the simplest techniques is a self-bootstrapping transistor. A control signal is applied to a control electrode of a transistor. Subsequently a full power supply timing signal is applied to a first current electrode. If the control signal is a logic high near 5 volts, for example 3 to 4 volts, the occurrence of the timing signal will cause the voltage of the control electrode to be raised well above 5 volts due to the capacitive coupling between the first current electrode and the control electrode. This allows the full signal strength of the timing signal to be coupled to a second current electrode of the transistor. Consequently, the self-bootstrapping transistor provides a full power supply signal of 5 volts as an output on its second current electrode in response to the control signal being a logic high and the occurrence of the timing signal. When the control signal is a logic low at ground potential, the control electrode of the transistor is held to ground so that the transistor will not turn on. Consequently, the timing signal is not coupled to the second current electrode. Accordingly, an output is provided which correlates to the control signal upon the occurrence of the timing signal.

This is a useful technique for providing a clocked output when the output is to be the same duration as the timing signal. For the case when the control signal is a logic high, the timing signal switching from a logic high to a logic low causes the output to also to switch to a logic low because the self-bootstrapping transistor is still turned on. This problem has been partially solved for clock drivers where the output is simply to occur for every occurrence of the timing signal by using a precharge signal and the removal thereof on the control electrode of the self-bootstrapping transistor in response to the timing signal. Other solutions involve using source-follower techniques which may additionally involve a bootstrap action with a capacitor connected between a gate and a source.

SUMMARY OF THE INVENTION

An object of the present invention is to provide an improved clocked buffer.

Another object of the invention is to provide a clocked buffer with a self-bootstrapping transistor which is disabled in response to providing an output.

Yet another object of the invention is to provide a clocked buffer with a self-bootstrapping transistor which provides an output in response to a clock signal and which is ensured of being disabled subsequent to providing the output by a delay circuit responsive to the output.

These and other objects of the invention are provided in a clocked buffer which provides an output signal in response to an input signal and a clock signal. A first transistor has a control electrode for receiving the input signal, a first current electrode for receiving the clock signal, and a second current electrode for providing the output signal. A disable circuit coupled to the control electrode of the first transistor and the output signal for disabling the first transistor subsequent to the occurrence of the output signal.

DESCRIPTION OF THE DRAWING

Shown in the single FIGURE is a circuit diagram of a clocked buffer circuit according to a preferred embodiment of the invention.

DESCRIPTION OF A PREFERRED EMBODIMENT

Shown in the single FIGURE is a clocked buffer 10 comprised generally of a self-bootstrapping transistor 11, an isolation transistor 12, an input inverter 13, a disable circuit 14, and a transistor 15. Input inverter 13 comprises a transistor 16 and a transistor 17. Disable circuit 14 comprises a transistor 18, a transistor 19, and a transistor 20. Transistor 11 is a natural transistor having a threshold voltage of 0.0 to 0.4 volt. Transistors 12, 15, 17, 18 and 19 are enhancement transistors having a threshold voltage of 0.6 to 1.2 volts. Transistors 16 and 20 are depletion transistors having a threshold voltage of $-1.1$ to $-1.4$ volts. Transistors 11, 12, 15, 16, 17, 18, 19 and 20 are all N channel insulated gate field effect transistors (IGFETs).

Transistor 11 has a first current electrode for receiving a first clock signal C1, a second current electrode for providing an output signal VO, and a control electrode. Transistor 12 has a control electrode connected to a positive power supply terminal $V_{DD}$ for receiving a positive power supply voltage, for example, 5 volts, a first current electrode connected to the control electrode of transistor 11, and a second current electrode. The bidirectional current carrying nature of IGFETs is reflected in describing transistors 11 and 12 as having first and second current electrodes. Each of the other transistors has a current carrying electrode connected to $V_{DD}$ or a negative power supply terminal for receiving current, shown as ground. Accordingly, the terms source, drain, and gate will be used.

Transistor 15 has a drain connected to the second current electrode of transistor 11, a source connected to ground, and a gate for receiving a second clock signal C2. Transistor 16 has a drain connected to $V_{DD}$, and a gate and a source connected together. Transistor 17 has a gate for receiving an inverted input signal $\overline{VI}$, a drain connected to the gate and source of transistor 16, and a source connected to ground. Transistor 18 has a drain as an output of disable circuit 14 connected to the drain of transistor 17, a source connected to ground, and a gate. Transistor 19 has a drain connected to $V_{DD}$, a source connected to the gate of transistor 18, and a gate as an input of disable circuit 14 connected to the second current electrode of transistor 11. Transistor 20 has a gate and a source connected to ground, and a drain connected to the source of transistor 19.

Signal $\overline{VI}$ can be a logic high or a logic low. When signal $\overline{VI}$ is a logic low, transistor 17 is turned off so that the voltage at $V_{DD}$, 5 volts, is coupled to the gate of transistor 11 via transistors 16 and 12. Transistor 12 will cause a threshold voltage drop so that the voltage present at the gate of transistor 11 will be less than 5 volts. With transistor 11 turned on, signal $V_0$ will be affirmatively pulled to a logic low while signal C1 is a logic low. Signal C1 subsequently switches to a logic high which causes the voltage on the control electrode of transistor 11 to rise well above 5 volts as a result of the capacitive coupling between the first current electrode and the control electrode of transistor 11. Consequently, the full signal strength of signal C1 is coupled through transistor 11 to provide output signal VO. Because transistor 11 is a natural transistor, it is turned on harder than an enhancement transistor would be and thus minimizes coupling resistance between its first and second current electrodes. Transistor 12 isolates the control electrode of transistor 11 from transistor 16. This is necessary because transistor 16 would tend to prevent the voltage on its source from exceeding 5 volts because its drain is connected to $V_{DD}$. Transistor 12 is turned off after the occurrence of signal C1 because neither the first nor the second current electrode of transistor 12 is at a threshold voltage or more below the voltage at $V_{DD}$.

As signal VO rises to a logic high in response to the occurrence of signal C1, transistor 19 turns on. This causes the gate of transistor 18 to rise in voltage. When the threshold voltage of transistor 18 is exceeded it turns on, causing the second current electrode of transistor 12 to be pulled to ground. Transistor 12 turns on, coupling the control electrode of transistor 11 to ground via transistors 12 and 18. Transistor 11 is thereby turned off. Due to the propagation delay through disable circuit 14 and transistor 12, signal VO reaches the full signal strength of signal C1 before transistor 11 turns off. When signal C1 subsequently switches to a logic low, signal VO remains at a logic high because transistor 11 is turned off. Stray capacitance associated with the second current electrode of transistor 11, the drain of transistor 15, and to a lesser extent the gate of transistor 19 hold signal VO at a logic high temporarily. Signal VO is brought to a logic low in response to signal C2 switching to a logic high. At the desired time following signal C1 switching to a logic low, signal C2 switches to a logic high, turning on transistor 15 which causes signal VO to switch to a logic low. With signal VO at a logic low, transistor 19 turns off. Transistor 20, acting as a resistor, then causes the gate of transistor 18 to be coupled to ground, turning off transistor 18.

The voltage level at the control electrode of transistor 11 is then dependent on the logic state of signal $\overline{VI}$. If signal $\overline{VI}$ is a logic low then transistor 17 is turned off with the consequent coupling of $V_{DD}$ to the control electrode of transistor 11 via transistors 16 and 12 as previously described. If such is the case, prior to the occurrence of signal C1, signal C2 must be removed to a logic low. Subsequent to the removal of signal C2 but prior to the occurrence of signal C1, signal VO will remain at a logic low. Because there is nothing to drive signal VO toward a logic high, the stray capacitance is sufficient to hold signal VO to a logic low. Operation of buffer 10 is then as previously described.

If signal $\overline{VI}$ is instead a logic high, transistor 17 will be turned on, coupling the gate of transistor 11 to ground via transistor 12. With a grounded gate, transistor 11 will be turned off. Consequently upon the occurrence of signal C1, signal VO will remain at a logic low. Thus it is shown that when signal $\overline{VI}$ causes a logic low to be present at the control electrode of transistor 11, signal VO is provided at a logic low upon buffer 10 being clocked by signal C1. Whereas, when signal $\overline{VI}$ causes a logic high to be present on the gate of transistor 11, signal VO is provided at a logic high in response to buffer 10 being clocked by signal C1. In such a case, signal VO remains at a logic high until signal C2 occurs. Signal VO is maintained at a logic high even upon prior removal of signal C1, because transistor 11 is disabled by disable circuit 14 prior to signal C1 being removed. Transistor 11 is disabled in response to the occurrence of signal VO. Disable circuit 14 delays the disabling of transistor 11 so that signal VO reaches the full signal strength of signal C1 prior to transistor 11 being disabled. The delay between the occurrence of signal VO and the disabling of transistor 11 is ensured because the disabling is triggered by the actual occurrence of signal VO.

It should also be pointed out that transistors 16, 17, and 18 can be viewed as forming a 2 input NOR gate with a first input for receiving signal $\overline{VI}$ and a second input coupled to the drain of transistor 20 and the source of transistor 19. With the second input at a logic low the NOR gate provides an output responsive to signal $\overline{VI}$ to the control electrode of transistor 11. When signal VO switches to a logic high, transistors 19 and 20 provide a logic high to the second input and thereby causing the NOR gate to disable transistor 11. In this view, the delay is caused by transistors 19 and 20 and the NOR gate.

While the invention has been described in a preferred embodiment, it will be apparent to those skilled in the art that the disclosed invention may be modified in numerous ways and may assume many embodiments other than that specifically set out and described above.

Accordingly, it is intended by the appended claims to cover all modifications of the invention which fall within the true spirit and scope of the invention.

We claim:

1. A clocked buffer circuit for providing an output signal in response to an input signal and a clock signal, comprising:
    a NOR gate having an output, a first input for receiving an inverted input signal, and a second input;
    a first transistor having a control electrode coupled to the output of the NOR gate, a first current electrode for receiving the clock signal, and a second current electrode for providing the output signal; and
    delay means having an input for receiving the output signal and an output coupled to the second input of the NOR gate for providing a delay signal responsive to the output signal, wherein the delay signal is delayed in time from the occurrence of the output signal.

2. The clocked buffer circuit of claim 1 further comprising means for removing the output signal in response to a second clock signal.

3. A clocked buffer circuit for providing an output signal in response to an input signal and a clock signal, comprising:

a first transistor having a control electrode for receiving the input signal, a first current electrode for receiving a clock signal, and a second current electrode for providing the output signal;

a second transistor having a control electrode coupled to the second current electrode of the first transistor for receiving the output signal, a first current electrode coupled to a first power supply terminal, and a second current electrode;

resistive means for providing resistance between the second current electrode of the second transistor and a second power supply terminal; and a third transistor having a control electrode coupled to the second current electrode of the second transistor, a first current electrode coupled to ground, and a second current electrode coupled to the control electrode of the first transistor.

4. The clocked buffer circuit of claim 3 further comprising a fourth transistor having a control electrode for receiving an inverted input signal, a first current electrode coupled to the second power supply terminal, and a second current electrode coupled to the control electrode of the first transistor.

5. The clocked buffer circuit of claim 4 comprising a fifth transistor interposed between the second current electrode of the fourth transistor and the control electrode of the first transistor, wherein said fifth transistor has a control electrode coupled to the first power supply terminal, a first current electrode coupled to the second current electrode of the fourth transistor, and a second current electrode coupled to the control electrode of the first transistor.

6. The clocked buffer circuit of claim 5 further comprising second resistive means coupled between the first power supply terminal and the second current electrode of the fourth transistor.

7. The clocked buffer circuit of claim 6 further comprising a sixth transistor having a control electrode for receiving a second clock signal, a first current electrode coupled to the second power supply terminal, and a second current electrode coupled to the second current electrode of the first transistor.

8. The clocked buffer circuit of claim 2 further comprising a fourth transistor having a control electrode for receiving a second clock signal, a first current electrode coupled to a power supply terminal, and a second current electrode coupled to the second current electrode of the first transistor.

* * * * *